(12) United States Patent
Yang

(10) Patent No.: US 6,696,163 B2
(45) Date of Patent: Feb. 24, 2004

(54) LIQUID CRYSTAL POLYMERS FOR FLEXIBLE CIRCUITS

(75) Inventor: Rui Yang, Austin, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 10/093,119

(22) Filed: Mar. 7, 2002

(65) Prior Publication Data

US 2002/0155280 A1 Oct. 24, 2002

Related U.S. Application Data

(63) Continuation-in-part of application No. 09/947,082, filed on Sep. 4, 2001, which is a continuation-in-part of application No. 09/618,753, filed on Jul. 18, 2000, now Pat. No. 6,403,211.

(51) Int. Cl.$^7$ .................................................. B32B 3/00
(52) U.S. Cl. ........................ 428/458; 428/209; 428/626
(58) Field of Search ................................ 428/209, 626, 428/458

(56) References Cited

U.S. PATENT DOCUMENTS

| | | |
|---|---|---|
| 3,448,098 A | 6/1969 | Gaines et al. |
| 3,469,982 A | 9/1969 | Celeste |
| 3,526,504 A | 9/1970 | Celeste |
| 3,867,153 A | 2/1975 | MacLachlan |
| 4,737,398 A | 4/1988 | Ikenaga et al. |
| 4,966,807 A * | 10/1990 | Harvey et al. ............... 428/220 |
| 4,975,312 A | 12/1990 | Lusignea et al. |
| 4,995,941 A | 2/1991 | Nelson et al. |
| 4,997,724 A * | 3/1991 | Suzuki et al. ............... 428/626 |
| 5,066,545 A | 11/1991 | Walsh |
| 5,145,553 A | 9/1992 | Albrechta et al. |
| 5,217,571 A | 6/1993 | Rosenau et al. |
| 5,227,008 A | 7/1993 | Klun et al. |
| 5,443,865 A | 8/1995 | Tisdale et al. |
| 5,614,114 A | 3/1997 | Owen |
| 5,701,218 A | 12/1997 | Boutaghou |
| 5,869,899 A | 2/1999 | Arledge et al. |
| 5,891,528 A | 4/1999 | Turek et al. |
| 5,891,795 A | 4/1999 | Arledge et al. |
| 5,956,212 A | 9/1999 | Zhu |
| 6,114,492 A | 9/2000 | Linstid, III et al. |
| 2002/0162218 A1 * | 11/2002 | Skorupski et al. ............ 29/847 |

FOREIGN PATENT DOCUMENTS

| | | |
|---|---|---|
| EP | 0 507 332 A2 | 10/1992 |
| EP | 0 614 328 A1 | 9/1994 |
| EP | 0 697 278 A1 | 2/1996 |
| EP | 0 832 918 A1 | 4/1998 |
| EP | 1 069 209 A1 | 1/2001 |
| GB | 979779 | 1/1965 |
| JP | 10-168577 | 6/1998 |
| WO | WO 99/39021 | 8/1999 |
| WO | WO 00/23987 | 4/2000 |
| WO | WO 01/95683 A1 | 12/2001 |

OTHER PUBLICATIONS

YFLEX™ High density, multi–layered flexible circuit Yamaichi Electronics—Flexible Printed Circuit.
International Search Report for PCT/US03/06423.

* cited by examiner

*Primary Examiner*—Cathy Lam
(74) *Attorney, Agent, or Firm*—Melanie G. Gover; Alan Ball

(57) ABSTRACT

A process for providing a metal-seeded liquid crystal polymer comprising the steps of providing a liquid crystal polymer substrate to be treated by applying an aqueous solution comprising an alkali metal hydroxide and a solubilizer as an etchant composition for the liquid crystal polymer substrate. Further treatment of the etched liquid crystal polymer substrate involves depositing an adherent metal layer on the etched liquid crystal polymer substrate. An adherent metal layer may be deposited using either electroless metal plating or vacuum deposition of metal such as by sputtering. When using electroless metal plating, a tin(II) solution applied to the liquid crystal polymer provides a treated liquid crystal polymer substrate to which the application of a palladium(II) solution provides the metal-seeded liquid crystal polymer. The etchant composition comprises a solution in water of from 35 wt. % to 55 wt. % of an alkali metal salt, and from 10 wt. % to 35 wt. % of a solubilizer dissolved in the solution to provide the etchant composition suitable for etching the liquid crystal polymer at a temperature from 50° C. to 120° C. A flexible circuit comprising a liquid crystal polymer film having through-holes and related shaped voids may be formed using etchant compositions as previously described. Etchant solutions may be used to prepare the surfaces of materials for formation of composite structures useful in applications including flexures for hard disk drives.

21 Claims, No Drawings

LIQUID CRYSTAL POLYMERS FOR FLEXIBLE CIRCUITS

This application is a continuation-in-part application of U.S. patent application Ser. No. 09/947,082, now pending, filed Sep. 4, 2001 which is a continuation-in-part of patent application Ser. No. 09/618,753, filed Jul. 18, 2000, now U.S. Pat. No. 6,403,211.

FIELD OF THE INVENTION

The invention relates to low dielectric constant films suitable for use in flexible circuit applications and more particularly to chemical etching of flexible films and composites that include liquid crystal polymers (LCP).

BACKGROUND TO THE INVENTION

An etched copper or printed polymer thick film circuit pattern over a polymer film base may be referred to as a flexible circuit or flexible printed wiring. As the name suggests, flexible circuitry can move, bend and twist without damaging the conductors to permit conformity to different shapes and unique package sizes. Originally designed to replace bulky wiring harnesses, flexible circuitry is often the only solution for the miniaturization and movement needed for current, cutting-edge electronic assemblies. Thin, lightweight and ideal for complicated devices, flexible circuit design solutions range from single-sided conductive paths to complex, multilayer three-dimensional packages. In a recent development, a flexible circuit provides connection to the magnetic head carried by the slider of a disk drive suspension assembly. This overcomes difficulties of connecting disk drive circuitry to small magneto-resistive (MR) recording heads.

Commonly used dielectric film base materials for flexible electronic packaging include polyimide, polyester terephthalate, random-fiber aramid and polyvinyl chloride. Changes in electronic device design create the need for new materials with properties surpassing the electrical performance and processing capabilities of the substrates listed previously. For example, a lower dielectric constant allows faster electrical signal transfer, good thermal performance facilitates cooling for a package, a higher glass transition or melting temperature improves package performance at higher temperature, and lower moisture absorption leads to signal and data processing at higher and higher frequencies.

Polyimide film is a commonly used substrate for flexible circuits that fulfil the requirements of complex, cutting-edge electronic assemblies. The film has excellent properties such as thermal stability and low dielectric constant, but represents a limiting factor to additional gain in the speed or frequency at which electronic components may operate. A major drawback to further progress using polyimide film relates to the way in which polyimide absorbs moisture to levels that interfere with high frequency device performance. Higher frequency operation will require the identification or development of substrate materials with less susceptibility to moisture absorption.

Liquid crystal polymer (LCP) films represent suitable materials as substrates for flexible circuits having improved high frequency performance. Generally they have lower dielectric loss, and absorb less moisture than polyimide films. These beneficial properties of liquid crystal polymers were known previously but difficulties with processing prevented application of liquid crystal polymers to complex electronic assemblies.

A laminate including a layer of copper bonded to a layer of liquid crystalline polymer provides a suitable starting material for printed wiring board manufacture. U.S. Pat. No. 4,737,398 describes laminate formation in a process that applies molten liquid crystalline polymer to the surface of a metal foil. International application WO 00/23987 describes the use of a high temperature laminating press to form a laminate material having a liquid crystal polymer melted for bonding a stainless steel foil to a copper foil. There is no measure of interlayer bond strength following lamination. This tri-layer material appears useful for applications referred to as flex-on-suspension (FOS) and trace suspension assemblies (TSA) and related disk drive suspension assemblies. However, device manufacture was described only in vague terms of conventional processing. Also there is nothing to show successful achievement of device performance in its intended application.

The development of multiaxial, e.g. biaxial, film processing techniques expanded the use of liquid crystal polymer film for flexible circuit applications. U.S. Pat. No. 4,975,312 describes a printed wiring board substrate prepared from a multiaxially oriented thermotropic liquid crystalline polymer film having a tailored coefficient of thermal expansion in the X-Y direction and a thickness of not more than about 100 $\mu$m. Materials of this type offer several potential advantages over polyimide films as flex circuit substrates. Such potential advantages led to the use of readily available processing techniques for producing single layer or multi-layer circuit structures supported by one or more layers of a liquid crystal film substrate. A multilayer flexible circuit is a combination of three or more layers of single or double-sided flexible circuits laminated together and processed with drill and plating to form plated through-holes. This creates conductive paths between the various layers without having to use multiple soldering operations.

Reference to drilling for the formation of through-holes reflects the emphasis on physical methods such as mechanical drilling, punching, laser ablation and plasma drilling for via and related circuit feature formation in liquid crystal polymer films. An alternative to conventional drilling and related techniques for hole formation in flexible circuit substrates was introduced as Y-FLEX™ by Yamaichi Corporation. Information describing Y-FLEX™ presents it as a microvia flexible wiring board using LCP resin insulation material and employing an internal conductive bump layer connection. Interconnection of Y-FLEX™ multilayer circuits occurs by conductive bumps penetrating through insulating LCP layers without the need for through-holes.

Although the several physical methods outlined above produce holes and related shaped voids in LCP, there are no reports of chemical methods for producing flexible circuits using liquid crystalline polymer substrates. Chemical etchant solutions for polyimide substrates are well known for production of polyimide-based flexible circuits. However, as shown in European Patent Application No. EP 0832918 A1, there is no single etchant composition capable of effecting development of circuit features in all types of polyimide. It appears that selection of etchant solutions depends upon the materials used for preparing a specified polyimide. Also aqueous developable photoresists disintegrate under the vigorous attack of etchant compositions described in the published application (EP 0832918).

Having less solubility than polyimide films, liquid crystal polymer films cannot be processed effectively using in-line chemical systems and known etchant compositions. There appears to be only limited information referring directly to etchant compositions for liquid crystal polymers. U.S. Pat. Nos. 5,891,795 and 5,896,899 describe a metallization process making reference to liquid crystal polymers among a number of suitable substrates. The metallization process includes electroless deposition or vacuum deposition of a seed layer to be augmented with additional metal layers using conventional plating techniques. A function of the seed layer is to provide an adhesive link between the plated layers and the substrate. However, there is nothing to demonstrate how well the seed layer adheres to any of the substrates listed by either of the references. Published application WO 99/39021 describes electrolytic plating of elemental palladium either sputtered or ion-plated on the surface of liquid crystal polymers.

U.S. Pat. No. 5,443,865 describes a relatively complex process for applying metal seed layers to substrates. Reference to liquid crystal polymers is absent from all but the patent claims. European patent application EP 1069209 describes the plating of plastics using catalytic filler contained within the plastic. Formation of a metal layer on a liquid crystal plastic requires treatment with an alkaline solution to dissolve the plastic followed by treatment with acid to activate the exposed catalyst. The exposed catalyst induces metal deposition from an electroless metal plating bath. There is no suggestion that treatment in alkaline solution affects the adhesion of metal to plastic. Such consideration would not be necessary since the plastic acts as a binder to hold catalytic filler particles.

As well as the need for novel chemical surface treatments of liquid crystal polymers, the need exists to use chemical shaping by e.g. chemical etching to introduce selected features into liquid crystal substrates. There are no reports of chemically etching liquid crystal polymer films to form features such as through holes. Chemical etching to form through holes in flexible circuit substrates is advantageous because it leads to the formation of unsupported or cantilevered lead structures, which cannot be produced by conventional physical methods.

Since some steps of physical drilling and related processes tend to involve expensive equipment, set apart from the main flex circuit production line, there is a need for a more cost effective method for producing flexible circuits using liquid crystal polymer substrates. A further benefit would be the provision of flexible circuits, including unsupported leads.

SUMMARY OF THE INVENTION

The present invention provides an aqueous-based chemical solution for controllable etching of through-holes and other shaped voids in films comprising liquid crystal polymers (LCP) as flexible circuit substrates. LCP films may be etched at rates exceeding those currently attainable with Kapton polyimide film. This results from adjusting the composition of the chemical etch solution. The new etchant makes possible the alternative use of LCP film to replace polyimide as an etchable substrate for flex circuit manufacture, including flex circuits used in device assemblies such as flex-on-suspension assemblies of computer storage modules such as hard disk drives. Chemically etched LCP flexible films and circuits will meet the needs of more sophisticated electronic assemblies, satisfying new opportunities that exist beyond the capabilities of polyimide and LCP film processed using drilling, laser ablation and related conventional physical methods.

The highly alkaline developing solution, referred to herein as an etchant, comprises an alkali metal salt and a solubilizer. A solution of an alkali metal salt alone may be used as an etchant for polyimide but is ineffective for etching and developing LCP in the absence of the solubilizer. Typically the solubilizer is an amine compound, preferably an alkanolamine. The efficacy of an amine in an etchant solution according to the present invention depends upon its use with a relatively narrow range of concentrations of alkali metal salts including an alkali metal hydroxide particularly potassium hydroxide. This suggests that there is a dual mechanism at work for developing flex circuits based upon liquid crystal polymers, i.e. the amine acts as a solubilizer for the LCP but preferably within a limited range of concentrations of alkali metal salt in aqueous solution. Discovery of a limited range of etchant solutions allows the manufacture of flexible printed circuits having finely structured features previously unattainable using current methods, of drilling, punching or laser ablation. The use of aqueous etchant solutions and methods according to the present invention produced surface-treated films for improved bonding and flexible circuits including unsupported leads (also known as cantilevered leads) and vias with angled sidewalls, which cannot be achieved using the previously mentioned physical methods. Improvement in surface treatment of liquid crystal polymer films and formation of complex circuit structures using chemical etchants according to the present invention changed the status of liquid crystal polymers from somewhat intractable to versatile materials for an expanded range of applications. For example, the present invention provides a process that allows selective plating of metal trace patterns on LCP film. Using an additive technique, the process requires initial film surface modification with an etchant composition comprising an alkali metal salt and a solubilizer, as described previously, before the application of material that provides catalytic sites for metal deposition. Formation of catalytic sites may also be referred to as metal seeding. Further processing of a catalyzed liquid crystal polymer surface produces a pattern of circuit traces. Required steps include lamination of a resist over a catalyzed surface and development of a pattern in the resist. The development process exposes catalyzed sites on the liquid crystal polymer. A number of metal deposition steps may then be needed to add metal according to the pattern formed in the resist. Metal deposition may be accomplished using a combination of techniques including electroless plating and electrolytic plating to produce metal traces corresponding to the pattern of the catalyzed sites. The process limits exposure of the substrate to elevated temperature.

A process for producing a metal-seeded liquid crystal polymer comprises the steps of, providing a liquid crystal polymer substrate for treatment by applying an aqueous solution comprising an alkali metal hydroxide and a solubilizer to the liquid crystal polymer substrate to provide an etched liquid crystal polymer substrate. Further treatment of the etched liquid crystal polymer substrate involves depositing an adherent metal layer on the etched liquid crystal polymer substrate. An adherent metal layer may be deposited using either electroless metal plating or vacuum deposition of metal such as by sputtering.

When using electroless metal plating, the process for producing a metal-seeded liquid crystal polymer comprises the steps of providing a liquid crystal polymer substrate to which an aqueous solution comprising from about 40 wt % to about 50 wt % of potassium hydroxide and from about 10 wt % to about 35 wt % of ethanolamine is applied to provide an etched liquid crystal polymer substrate. Applying a tin(II) solution to the etched liquid crystal polymer substrate followed by a palladium(II) solution provides the metal-seeded liquid crystal polymer.

The surface treatment of liquid crystal polymer substrates uses an etchant composition comprising a solution in water of from 35 wt. % to 55 wt. % of an alkali metal salt, and from 10 wt. % to 35 wt. % of a solubilizer dissolved in the solution to provide the etchant composition suitable for etching the liquid crystal polymer at a temperature from 50° C. to 120° C.

Liquid crystal polymers may be etched with etchant compositions according to the present invention to provide a flexible surface treated film having improved bonding to a variety of substrates. Further etchant processing yields a circuit comprising a liquid crystal polymer film having through-holes and related shaped voids formed therein using an etchant composition comprising a solution in water of from 35 wt. % to 55 wt. % of an alkali metal salt; and from 10 wt. % to 35 wt. % of a solubilizer dissolved in the solution to provide the etchant composition suitable for etching the liquid crystal polymer at a temperature from 50° C. to 120° C.

The invention also includes a process for etching a pattern in a liquid crystal polymer. Suitable process steps include, providing a liquid crystal polymer; applying a layer of photoresist to the liquid crystal polymer; exposing the photoresist to a pattern of radiation to crosslink portions of the photoresist exposed to the radiation and using a developer solution to remove unexposed photoresist. This exposes portions of the liquid crystal polymer which may be etched by contact, at a temperature from about 50° C. to about 120° C., with an etchant composition comprising a solution in water of from about 35 wt. % to about 55 wt. % of an alkali metal salt; and from about 10 wt. % to about 35 wt. % of a solubilizer dissolved in the solution. The etchant composition etches previously unexposed portions of the liquid crystal polymer, either by immersion in the etchant or using spray-etching techniques.

Aqueous etchants according to the present invention may be used to pre-treat surfaces of materials used herein for forming a composite material comprising a film having a first etchant treated surface opposite a second etchant treated surface and a metal foil having at least one acid treated surface having a bond to the first etchant treated surface of the film. Interlayer bonding of the foil to the film occurs by application of a force to press the metal foil against the film at temperatures that cause flow of the film.

Composite structures may be used to form a flexure for a hard disk drive. The flexure includes a laminate comprising a film of a liquid crystal polymer having a first etchant treated surface opposite a second etchant treated surface that has at least one electrically conducting trace thereon. A shaped metal foil having at least one acid treated surface forms a bond to the first etchant treated surface of the liquid crystal polymer film. The bond forms by application of a force to press the metal foil against the liquid crystal polymer film at temperatures that cause flow of the liquid crystal polymer film.

The present invention includes a process for forming a composite material by steps that include providing a liquid crystal polymer film having a first etchant treated surface opposite a second etchant treated surface. A metal foil having at least one acid treated surface is then placed with the acid treated surface against the first etchant treated surface. Application of a force presses the metal foil against the film at temperatures that cause flow of the film to form a bond between the film and the metal foil.

As used herein all amounts included as percentages refer to weight percent of a designated component.

DETAILED DESCRIPTION OF THE INVENTION

The present invention provides a film substrate for flexible circuits capable of operating at higher frequencies than currently available flex circuit substrates, particularly polyimide films such as KAPTON™ and APICAL™. Attainment of higher frequency performance, in response to the demand for faster electronic devices, results from the gradual development of methods for processing liquid crystal polymers that were once considered to be relatively intractable. A process development, described in U.S. Pat. No. 4,975,312, provided multiaxially (e.g. biaxially) oriented thermotropic polymer films of commercially available liquid crystal polymers (LCP) identified by the brand-names VECTRA® (naphthalene based, available from Hoechst Celanese Corp.) and XYDAR® (biphenol based, available from Amoco Performance Products). Multiaxially oriented LCP films of this type represent suitable substrates for flexible printed circuits and circuit interconnects suitable for production of device assemblies such as flex on suspension assemblies used in hard disk drives. Characteristics of LCP films include electrical insulation, moisture absorption less than 0.5% at saturation, a coefficient of thermal expansion approaching that of the copper used for plated through holes, and a dielectric constant not to exceed 3.5 over the functional frequency range of 1 kHz to 45 GHz.

The development of multiaxially oriented LCP films, while providing a film substrate for flexible circuits and related devices, was subject to limitations in methods for forming and bonding such flexible circuits. An important limitation was the lack of a chemical etch method for use with LCP. Without this technique, complex circuit structures such as unsupported, cantilevered leads or through holes or vias having angled sidewalls cannot be included in a printed circuit design.

Advancements according to the present invention now provide an aqueous-based chemical solution for controllable etching of unsupported leads, through-holes with angled sidewalls, and other shaped voids in films comprising multiaxially oriented, thermotropic, liquid crystal polymers as flexible circuit substrates. After processing by chemical etching, flexible circuits using LCP film substrates possess all of the benefits of similarly processed polyimide films with the additional benefits of higher frequency operation along with, and because of, lower moisture absorption.

Flexible circuit structures according to the present invention result from etching a LCP polymer film during contact of the film with an aqueous alkaline etchant at a temperature of from 50° C. (122° F.) to 120° C. (248° F.). The formation of unsupported leads, through holes and other circuit features in the LCP film requires protection of portions of the polymeric film using a mask of a photo-crosslinked negative acting, aqueous processible photoresist. During the etching process the photoresist exhibits substantially no swelling or delamination from the LCP polymer film.

Negative photoresists suitable for use with liquid crystal polymers according to the present invention include negative acting, aqueous developable, photopolymer compositions such as those disclosed in U.S. Pat. Nos. 3,469,982, 3,448,098, 3,867,153, and 3,526,504. Such photoresists include at least a polymer matrix including crosslinkable monomers and a photoinitiator. Polymers typically used in photoresists include copolymers of methyl methacrylate, ethyl acrylate and acrylic acid, copolymers of styrene and maleic anhydride isobutyl ester and the like. Crosslinkable monomers may be multiacrylates such as trimethylol propane triacrylate.

Commercially available aqueous base, e.g. sodium carbonate developable, negative acting photoresists employed according to the present invention include polymethylmethacrylates such as RISTON photoresist materials e.g. RISTON 4720 available from duPont de Nemours and Co. Other useful examples include AP850 available from LeaRonal Inc. and PHOTEC HU350 available from Hitachi Chemical Co. Ltd. Photoresist compositions using the tradename AQUAMER are available from Hercules Inc. There are several series of AQUAMER photoresists including the "SF" and "CF" series with SF120, SF125, and CF2.0 being representative of these materials.

Polyimide films may be etched using solutions of potassium hydroxide alone, as described in mutually owned U.S. Pat. No. 5,227,008. However, liquid crystal polymers are unaffected by potassium hydroxide and require highly alkaline aqueous etchant solutions according to the present invention comprising water soluble salts of alkali metals and ammonia combined with a solubilizer for the LCP film. Suitable water soluble salts include potassium hydroxide (KOH), sodium hydroxide (NaOH), substituted ammonium hydroxides, such as tetramethylammonium hydroxide and ammonium hydroxide. Bases with low water solubility such as lithium hydroxide, aluminum hydroxide, and calcium hydroxide are not useful in processes of the invention due to solution saturation below useful concentrations. Useful concentrations of the etchant solutions vary depending upon the thickness of the LCP film to be etched, as well as the type and thickness of the photoresist chosen. Typical useful concentrations range from 35 wt. % to 55 wt. %, preferably from 40 wt. % to 50 wt. % of a suitable salt and from 10 wt. % to 35 wt. %, preferably from 15 wt. % to 30 wt. % of a solubilizer. The use of KOH is preferred for producing a highly alkaline solution since KOH-containing etchants provide optimally etched features in the shortest amount of time. One highly preferred embodiment, uses potassium hydroxide at a concentration of from 43 wt. % to 48 wt. %.

Solubilizers for etchant solutions according to the present invention may be selected from the group consisting of amines, including ethylene diamine, propylene diamine and the like, and alkanolamines such as ethanolamine, propanolamine and the like. Under the conditions of etching, unmasked areas of an LCP film substrate become soluble by action of the solubilizer in the presence of a sufficiently concentrated aqueous solution of e.g. an alkali metal salt. The time required for etching depends upon the type and thickness of the film to be etched and is typically from 30 seconds to 10 minutes. Using a preferred etchant solution, of concentrated KOH and ethanolamine, the etching time for a 50 μm (2.0 mil) LCP film is from 30 seconds to 240 seconds. The etching solution is generally at a temperature of 50° C. (122° F.) to 120° C. (248° F.) preferably from 70° C. (160° F.) to 95° C. (200° F.).

In the past, flexible circuits that include a liquid crystal polymer substrate typically required a starting material having a metal surface coating on at least one side of a polymer film. Circuit patterns were then developed using a subtractive process to remove metal from those areas not requiring conductive circuit traces. The subtractive method was necessary to overcome previous difficulties with the use of vacuum sputtering or vapor evaporation processes for applying metal to liquid crystal polymers without the use of a bonding agent.

The use of etching solutions according to the present invention facilitates surface preparation of liquid crystal polymers for deposition and adhesion of metal, either as a continuous metal coat or preferably in the form of a metal pattern. Surface preparation for improved metal adhesion promotes the use of additive methods that produce metal patterns on liquid crystal polymer substrates. Suitable means for metal application may include vacuum sputtering, or vapor evaporation, or electroless plating or the like after suitable surface treatment of the liquid crystal polymer. A primary objective of surface treatment is to promote compatibility between a metal deposit and the liquid crystal polymer. With suitable compatibility, a metal deposit adheres to the polymer surface producing a bond that resists separation.

Suitable surface treatment of liquid crystal polymers includes a process according to the present invention. This process allows selective plating of metal trace patterns on LCP film. Using an additive technique, the process requires initial film surface modification before the application of material that provides catalytic sites for metal deposition. Formation of catalytic sites may also be referred to as metal seeding. Further processing of a catalyzed liquid crystal polymer surface produces a pattern of circuit traces. Required steps include lamination of a resist over a catalyzed surface and development of a pattern in the resist. The development process exposes catalyzed sites on the liquid crystal polymer. A number of metal deposition treatments may then be needed to add metal according to the pattern formed in the resist. Metal deposition may be accomplished using a combination of techniques including electroless plating and electrolytic plating to produce metal traces corresponding to the pattern of the catalyzed sites. Copper or nickel or gold or combinations thereof may be deposited as described above. Following the additive process for conductive circuit formation, optional etching of vias and removal of residual resist material provides a finished circuit structure. In this process the bond strength of metal to liquid crystal polymer is sufficient without the use of a tie layer. As an additional benefit, the process limits exposure of the liquid crystal polymer substrate to elevated temperature.

A circuit augmentation process according to the present invention applies preferably to the manufacture of two-layer flexible circuits formed on surfaces of liquid crystal polymer films without using bonding adhesive layers. The additive metal process achieves conductive trace formation using electroless plating of fine pitch structures excluding bussline features.

The present invention allows change in the contour of through holes, vias and blind vias depending upon the concentration of solubilizer in the etchant and the temperature of etching. A solution of etchant containing 10 wt. % to 15 wt. % ethanolamine provides a through hole angle of about 25° to about 35° while ethanolamine concentration of 15 wt. % to 30 wt. % in the etchant solution provides a through hole side-wall angle of about 35° to about 45°. The side-wall angle also changes with alkali metal hydroxide concentration in the etchant solution, such that over the concentration range of from 35 wt. % KOH to 55 wt. % KOH the angle of the side-wall changes from about 25° to about 55°. Modification of the angle of the side-wall is not possible using drilling, punching or laser ablation. In these latter cases, the walls of through holes are substantially parallel.

The manufacture of flexible circuits according to the present invention comprises the step of etching which may be used in conjunction with various known pre-etching and post-etching procedures. The sequence of such procedures may be varied as desired for the particular application. A typical sequence of steps may be described as follows:

Aqueous processible photoresists are laminated over both sides of a substrate having a polymeric film side and a copper side (available from W.L. Gore and Assoc. of Japan and Kuraray Corp. of Japan), using standard laminating techniques. Typically, the substrate has a polymeric film layer of from 25 μm to 125 μm, with the copper layer being from 1 μm to 5 μm thick.

The thickness of the photoresist is from 25 μm to 50 μm. Upon imagewise exposure of both sides of the photoresist to ultraviolet light or the like, through a mask, the exposed portions of the photoresist become insoluble by crosslinking. The resist is then developed, by removal of unexposed polymer with a dilute aqueous solution, e.g., a 0.5–1.5% sodium carbonate solution, until desired patterns are obtained on both sides of the laminate. The copper side of the laminate is then further plated to desired thickness. Chemical etching of the LCP film then proceeds by placing the laminate in a bath of etchant solution, as previously described, at a temperature of 50° C. to 120° C. to etch away portions of the LCP polymer not covered by the crosslinked resist. This exposes certain areas of the original thin copper layer. The resist is then stripped from both sides of the laminate in a 2–5% solution of an alkali metal hydroxide at 25° C. to 80° C., preferably from 25° C. to 60° C. Subsequently, exposed portions of the original thin copper layer are etched using an etchant that does not harm the LCP film, e.g., PERMA-ETCH, available from Electrochemicals, Inc.

In an alternate process, the aqueous processible photoresists are laminated onto both sides of a substrate having a LCP film side and a copper side, using standard laminating techniques. The substrate consists of a polymeric film layer 25 μm to 125 μm thick with the copper layer being from 9 μm to 40 μm thick. The photoresist is then exposed on both sides to ultraviolet light or the like, through a suitable mask, crosslinking the exposed portions of the resist. The image is then developed with a dilute aqueous solution until desired patterns are obtained on both sides of the laminate. The copper layer is then etched to obtain circuitry, and portions of the polymeric layer thus become exposed. An additional layer of aqueous photoresist is then laminated over the first resist on the copper side and crosslinked by flood exposure to a radiation source in order to protect exposed polymeric film surface (on the copper side) from further etching. Areas of the polymeric film (on the film side) not covered by the crosslinked resist are then etched with the etchant solution containing an alkali metal salt and LCP solubilizer at a temperature of 70° C. to 120° C., and the photoresists are then stripped from both sides with a dilute basic solution, as previously described.

To create finished products such as flexible circuits, interconnect bonding tape for "TAB" (tape automated bonding) processes, microflex circuits, and the like, conventional processing may be used to add multiple layers and plate areas of copper with gold, tin, or nickel for subsequent soldering procedures and the like as required for reliable device interconnection.

Improvement in bonding to a variety of other substrates occurs by chemical processing of liquid crystal polymer films according to the present invention. Treatment of surfaces using etchants described previously provides benefits for higher strength bonding of multilayer composites that include at least one layer of a liquid crystal polymer. Combining improvements described herein provides particular advantage to structures in which a metal layer supports a dielectric polymer carrier layer having a circuit pattern formed on its surface.

The flexure of a head suspension assembly (HSA) represents a structural element of a hard disk drive that may be fabricated using a multilayer composite. A flexure, as described in U.S. Pat. Nos. 5,701,218 and 5,956,212, comprises a layer of stainless steel for mechanical strength, a polyimide layer for electrical insulation and a ductile copper layer for electrical transmission. An improved flexure may be obtained using a liquid crystal polymer layer instead of the polyimide layer, which has poorer properties in terms of dielectric constant, dissipation factor and moisture pick-up.

Etchant compositions according to the present invention facilitate construction of an adhesive-free flexure in TSA (Trace Suspension Assembly) applications. A liquid crystal polymer film replaces the conventional layer of polyimide and obviates the need for two adhesive layers required in current flexure construction. The new flexure structure reduces material usage to no more than three layers bonded together without adhesive. It is also possible to produce a three-layer flexure structure starting with a composite consisting of a liquid crystal polymer layer bonded to a stainless steel layer. In this case, the liquid crystal polymer surface is subject to metal seeding, according to the present invention, for formation of electrically conductive metallic traces thereon.

International application WO 00/23987 suggests a liquid crystal polymer disk drive suspension assembly and a method for making the same. The assembly comprises a support, e.g. stainless steel, an electrically conductive layer, and a dielectric liquid crystal polymer material disposed between, in intimate contact with, and adhered to the support and the conductive layer. While including general discussion of laminate formation, using a heated flat-bed press, there is no evidence that an adhesive-free, three-layer laminate has adequate interlayer bonding. Processing conditions causing the liquid crystal polymer film to melt and adhere to both the stainless steel and copper alloy foil, do not convey information of the strength of bond formation when the liquid crystal polymer cools. This previous description also includes no evidence to show effective performance in disk drive suspension assemblies.

Preparation of flexures according to the present invention reveals the need for material conditioning that was not previously disclosed. The formation of a bonded laminate structure, during softening or melting of an intervening liquid crystal polymer layer, requires prior treatment of bonding surfaces to prevent delamination. Also there is evidence to show that successful formation of adhesive-free laminates depends upon the method used to form a liquid crystal polymer film. Preferably a laminated composite uses extruded and tentered (biaxially stretched) liquid crystal polymer films rather than melt-blown films. Selection of liquid crystal polymer film may also affect the ability to manufacture composite films using either a batch process or a continuous roll-to-roll process.

Flexures for TSA suspension assemblies previously used a laminated material, having five material layers including stainless steel foil (SST), bonding adhesive, polyimide (PI), bonding adhesive, and copper (Cu) foil. Laminates of this type present some difficulties in processing. For example, the formation of a pattern in the polyimide uses a plasma etching process that requires a thick resist layer to compensate for the etching rate of the adhesive that is slower than the plasma etching rate for either the resist itself or the polyimide beneath the adhesive. Other problems with adhesive interlayers include residual adhesive on the stainless steel surface and limitations in flexure flexibility due to the firmness and added weight of the bonding adhesive. The need for adhesive bonding increases the cost and causes losses in productivity for conventional flexure structures.

The present invention eliminates the need for adhesive and provides surface-treated films, from about 10 μm to about 50 μm thick, and foils that form laminates having high interlayer bond strength. Composite structures require a minimum of two layers one of which is capable of flowing or melting in contact with the other, during application of heat and pressure to provide a strongly bonded laminate. Preferably the thermoplastic layer is a liquid crystal polymer film, produced by melt extrusion and tentering. A preferred laminate comprises an A.I.S.I. (American Iron and Steel Institute) 302 stainless steel foil having a thickness of 25 μm (1.0 mil) melt-bonded to a film of a liquid crystal polymer 50 μm (2.0 mil) thick. Before lamination the bonding surface of the stainless steel receives an application of a strongly acidic etch composition, while opposite surfaces of the film of liquid crystal polymer receive a treatment of alkaline etchant. Acidic etches for stainless steel include corrosive acids such as chromic acid and mixtures of nitric acid and hydrochloric acid. Alkaline etchants suitable for treating liquid crystal polymers include those previously described containing an alkali metal salt and a substituted amine solubilizer. After etching, the treated surfaces are cleaned by rinsing with deionized water.

Adjusting the thickness of one or more of the layers may vary the thickness and flexibility of composite structures according to the present invention. Such adjustment may be achieved by etchant treatment at selected temperatures and material removal rates. For example, controlled etching may be used to alter the thickness of a film of liquid crystal polymer that was originally extruded and tentered to a thickness of about 25 μm to about 50 μm. Treatment occurs at elevated temperature, e.g. 90° C., over a time period of 60 seconds or more that reduces film thickness to 10 μm or less. To reduce thickness to less than about 15 μm the film may require addition of a support layer, such as a 3 μm flash layer of copper, before proceeding with controlled etching. Thickness adjustment may use either a batch process or continuous roll-to-roll process.

The following examples are meant to be illustrative and are not intended to limit the scope of the invention which is expressed solely by the claims.

EXPERIMENTAL

Experiments were conducted with LCP materials described as follows:

Film A—a LCP/copper laminate (W.L. Gore and Associates of Japan).
Film B—a LCP/copper laminate K-CT (Kuraray Corporation of Japan).
Film C—a LCP/copper laminate R-OC (Kuraray Corporation of Japan).
Film D—a LCP film 50 μm thick (W.L. Gore and Associates of Japan).
Film E—a LCP film 50 μm thick (Kuraray Corporation of Japan).

The etching rate of liquid crystal polymers was estimated by determining the time required to dissolve a film of a selected polymer in an etchant solution. Film A was further tested for etching performance of circuit features using resist coated film. Etchant solution performance was visually assessed using a ranking scheme wherein:

1=Satisfactory etching and appearance.
3=Marginal performance or attack of the resist.
5=Unsatisfactory performance Etchant Solutions Table 1 shows the compositions of etchant solutions 1–8 suitable, according to the present invention, for effectively etching liquid crystal polymer films as well as compositions C1–C6 that generally do not satisfy requirements for liquid crystal film etching.

TABLE 1

Etchant Solution Compositions 1–8 and C1–C6

| Etchant Solution | Composition - wt. % % EA*/% KOH/% Water |
|---|---|
| 1 | 20/40/40 |
| 2 | 33/40/27 |
| 3 | 10/45/45 |
| 4 | 20/45/35 |
| 5 | 19.3/48.2/32.5 |
| 6 | 10/50/50 |
| 7 | 20/38/42 |
| 8 | 15/44.7/40.3 |
| C1 | 21.9/31.2/46.9 |
| C2 | 33/33/34 |
| C3 | 15.7/33.7/50.6 |
| C4 | 17.6/35.6/45.8 |
| C5 | 0/40/60 |
| C6 | 0/50/50 |

*EA = Ethanolamine
KOH = Potassium Hydroxide

Testing Conditions for Liquid Crystal Polymer Film Solubility in Etchant Solutions Samples of 50 μm (2.0 mil) thick liquid crystal polymer film, 1 cm×1 cm square, were submerged in etchant solutions contained in an etchant bath. The temperature of the etchant was maintained at 85° C. and the time was recorded for dissolution of film samples in the etchant solutions shown in Table 1. Times exceeding about 10 minutes indicate poor etchant performance. Although some etchant mixtures rapidly dissolved the liquid crystal polymer samples, they did not perform well when the liquid crystal polymer was coated with an aqueous developable film resist material (see Table 2 solutions C1–C4).

Testing Conditions for Resist Coated Liquid Crystal Polymer Film

Two layers of 50 μm thick aqueous resists, available from DuPont under the tradename RISTON™ 4720, were laminated with heated rubber rolls to a flexible substrate consisting of 50 μm (2.0 mil) of LCP film on one side and copper on the other. The laminate was then exposed with ultraviolet (UV) light through a phototool or mask on each side and developed with 0.75% aqueous solution of sodium carbonate on both sides to obtain desired image of circuitry. Copper was then plated on the copper side of the laminate to 35 μm in thickness. The LCP side was then etched by dipping into an etchant bath containing one of the compositions listed in Table 1. The temperature of the etchant bath was controlled at 85° C. (185° F.). Each resist was then washed with water, and the resist was stripped with 2.5% KOH at 25° C. to 85° C. The condition of etched films was evaluated to determine etchant performance with Film A as recorded in Table 2.

TABLE 2

Solution and Etching Times for Film A

| Etchant Solution | LCP film | Time (min) + Film Only | Time (min) Resist | Etchant Performance |
|---|---|---|---|---|
| 1 | A | 6.3 | 8.5 | 1 |
| 2 | A | 1.6 | 5.0 | 1 |
| 3 | A | 4.5 | 11.0 | 3 |
| 4 | A | 2.4 | 5.5 | 1 |
| 5 | A | 2.4 | — | 1 |
| 6 | A | 3.0 | 6.5 | 1 |
| 7 | A | — | 6.5 | 1 |
| 8 | A | — | 6.0 | 1 |
| C1 | A | 4.0 | 10 | 5 |
| C2 | A | 2.7 | 6.5 | 3 |
| C3 | A | 5.2 | 10.0 | 5 |
| C4 | A | 2.7 | 9.5 | 5 |
| C5 | A | 26.4 | — | 5 |
| C6 | A | 24.6 | — | 5 |

TABLE 3

Solution and Etching Times for Film B

| Etchant Solution | LCP Film | Time (min) Film Only | Etchant Performance |
|---|---|---|---|
| 2 | B | 3.2 | 1 |
| 3 | B | 5.5 | 1 |
| 4 | B | 5.0 | 1 |
| 6 | B | 2.2 | 1 |
| C1 | B | >35.0 | 5 |
| C2 | B | 14.2 | 5 |
| C3 | B | >35.0 | 5 |
| C4 | B | >30.0 | 5 |
| C5 | B | >72.0 | 5 |

TABLE 4

Solution and Etching Times for Film C

| Etchant Solution | LCP Film | Time (min) Film Only | Etchant Performance |
|---|---|---|---|
| 2 | C | 3.5 | 1 |
| 3 | C | 5.7 | 1 |
| 4 | C | 5.2 | 1 |
| 6 | C | 2.3 | 1 |
| C1 | C | >35.0 | 5 |
| C2 | C | >10.0 | 5 |
| C3 | C | >60.0 | 5 |
| C4 | C | >30.0 | 5 |
| C5 | C | >72.0 | 5 |

Test Methods

Qualitative Adhesion Test (ASTM D3359-93)

The test method (ASTM D3359-93) requires the formation of an X-cut in the film of conductive metal applied to a liquid crystal polymer substrate. Pressure sensitive tape, applied over the X-cut, provides a qualitative measure of metal-to-substrate adhesion when removed from the test material. After removal of the test tape, the metal-to-substrate adhesion may be assessed using a suitable scale to indicate release or retention of metal.

Adhesion of Plated Metal to Liquid Crystal Polymer Film

The adhesion or bonding quality of conductors to the surface of liquid crystal polymer film was measured using the procedure outlined in standard test method IPC-TM 650. An Instron peel tester, operating at a rate of 1.2 cm/minute, was used as the test machine required by this test method.

Surface Preparation and Additive Metal Plating

EXAMPLE 1

Liquid crystal polymer film (Film D) obtained from W.L. Gore and Associates was chemically etched using a mixture of 45% KOH and 20% ethanolamine at 85° C. (185° F.) for 5–10 seconds. The modified film was immersed in a tin(II) solution comprising 10 g stannous chloride and 40 ml 35% hydrochloric acid per liter of solution. After an immersion time of approximately 15 seconds at room temperature the treated film was washed with deionized water. Immersion of the treated film in a palladium(II) solution, containing 0.25 g palladium(II) chloride and 2.5 ml 35% hydrochloric acid per liter of solution, for approximately 15 seconds provided a catalyzed film also referred to herein as a metal seeded film. Deionized water was used to rinse the film after immersion in the palladium(II) solution. The metal seeded film was plated in electroless nickel solution (UIC Nimuden SX available from Uyemura International Corporation, Ontario, Calif.) at 85° C. Plating times were 2 to 3 minutes to obtain several different thickness of samples. The plated thickness depends upon the plating time. There was no delamination with the Qualitative Adhesion tape peel test. In contrast, samples plated without chemical etching, as described above, showed evidence of metal delamination from the liquid crystal polymer surface under the conditions of qualitative adhesion testing.

EXAMPLE 2

The process of Example 1 was repeated using a liquid crystal polymer film designated as CT grade film available from Kuraray Corporation of Japan. After metal seeding film surfaces, previously etched for times between 20 seconds and 60 seconds, a metal deposit from a nickel electroless plating bath exhibited metal to film adhesion without delamination under the conditions of the tape peel test. In contrast, samples plated without chemical etching, as described above, showed evidence of metal delamination from the liquid crystal polymer surface under the conditions of qualitative adhesion testing.

EXAMPLE 3

A sample of nickel-plated film from Example 1 was immersed at 45° C. for 60 seconds in an electroless copper plating bath available as ENTHONE OMI Cu-872 from Enthone-OMI Incorporated. Copper metal, added by this process, adhered well to nickel traces produced by Example 1.

EXAMPLE 4

This example shows improved bonding of sputtered metal coatings to liquid crystal polymers previously treated using etchant solutions according to the present invention. In this case, a liquid crystal polymer film, etched as described in Example 1, was inserted into a bench top sputter coater to coat the film with Pd/Au at a current of 10 mA for 25 seconds. Prior art information suggests that the resulting metal deposit has a thickness in the range of 0.04 $\mu$m to 0.5 $\mu$m. Following sputter coating, the film was immersed at 45° C. for 60 seconds in an electroless copper plating bath available as ENTHONE OMI Cu-872 from Enthone-OMI Incorporated. The plated copper had a resistivity of less than 1.0 ohm-cm and was not removed during testing for delamination using the Qualitative Adhesion adhesive tape peel test.

EXAMPLE C1

Example C1 involved the application of a protective resist to a liquid crystal polymer film available from W.L. Gore and Associates. Removal of portions of the resist revealed a pattern of the exposed surface of the liquid crystal polymer film. The exposed polymer was corona treated using a hand torch device applied for 30 seconds. After corona treatment, the modified film was immersed in tin(II) solution for approximately 15 seconds and rinsed as described in Example 1. Immersion of the treated film in a palladium(II) solution, containing 0.25 g palladium(II) chloride and 2.5 ml 35% hydrochloric acid per liter of solution, for approximately 15 seconds provided a metal seeded film. Deionized water was used to rinse the film after immersion in the palladium(II) solution. The metal seeded film was plated in electroless copper solution at 50° C. Plating times of 1 to 2 minutes produced samples of differing metal thickness depending on the development time. The plated copper showed good conductivity but poor adhesion to the liquid crystal polymer. This observation is significant considering that the process of corona treatment and metal seeding is used as a conventional method for seeding polyimide substrates.

TABLE 5

Qualitative Metal Adhesion to Liquid Crystal Polymer Film

| Example | Qualitative Adhesion Test |
|---|---|
| 1 | No metal delamination |
| 2 | No metal delamination |
| 3 | No metal delamination |
| 4 | No metal delamination |
| C1 | Metal delamination observed |

EXAMPLE 5

Etchant solutions, according to the present invention, facilitate the use of vacuum sputtering as a process for depositing an adherent metal layer on a liquid crystal polymer film. Samples of a suitable 50 $\mu$m (2 mil) LCP film, available from W.L. Gore & Associates, were processed without treatment or treated with etchant solution as indicated in Table 6. After treatment, each film was placed in a vacuum chamber and an adherent metal deposit was applied using conventional sputtering techniques to apply chromium to a thickness from about 3 nm to about 20 nm. A layer of copper about 100 nm was sputtered over the chromium of the metal-seeded liquid crystal polymer films. The resulting sputtered films were electroplated to increase the copper thickness to about 10 $\mu$m.

Metal test patterns required by the IPC-TM 650 test method were generated using a conventional subtractive process for printed circuit preparation. Thereafter, Instron peel test results, listed in Table 6, revealed significant improvement of metal to liquid crystal polymer adhesion after polymer surface treatment using chemical etching compositions according to the present invention.

TABLE 6

Effect of Surface Treatment on Metal Adhesion

| Sample Condition | Peel strength N/mm (lb/in) |
|---|---|
| No treatment | 0.14 (0.79) |
| Etchant at 75° C. for 5.0 seconds | 0.41 (2.32) |
| Etchant at 80° C. for 10.0 seconds | 0.41 (2.36) |
| Etchant at 85° C. for 10.0 seconds | 0.42 (2.42) |

EXAMPLE 6

Example 6 is similar to example 5 except for the use of conventional sputtering techniques to deposit metal on a moving film, suspended between a pair of rolls. The film provided in roll-to-roll form was, as before, 50 $\mu$m (2.0 mil) thick liquid crystal polymer film. Before loading into the sputtering apparatus, each roll of film was either left untreated or chemically etched at about 50° C. (120° F.) at 72 inches/minute line speed. Table 7 records the results for untreated film and for two different rolls of liquid crystal polymer film chemically etched under the same conditions. In a sequence of treatments, sputtered chromium was first applied to each film to deposit a layer of metal from about 3 nm to about 20 nm thick. Each liquid crystal polymer film then received a coating of copper having a thickness from about 100 nm to about 200 nm copper. The resulting sputtered films were then treated to augment the sputtered copper with from about 10 $\mu$m to about 35 $\mu$m of electroplated copper.

Metal test patterns required by the IPC-TM 650 test method were generated using a conventional subtractive process for printed circuit preparation. Once again, Instron peel test results, listed in Table 7, revealed significant improvement of metal to liquid crystal polymer adhesion after polymer surface treatment using chemical etching compositions.

TABLE 7

Effect of Surface Treatment on Metal Adhesion

| Sample Condition | Copper thickness ($\mu$m) | Peel strength N/mm (lb/in) |
|---|---|---|
| No treatment | 10 | 0.16 (0.9) |
| Etchant at 50° C. at 72 ipm | 10 | 0.54 (3.1) |
| Etchant at 50° C. at 72 ipm | 35 | 1.0 (5.7) |

Preliminary treatment by etchants, according to the present invention, provides improvement of metal to polymer adhesion using metallization processes involving either electroless plating or vacuum deposition, e.g. sputtering. As described above, an etched liquid crystal polymer may be produced using either a batch process or a continuous roll-to-roll process.

Laminate Formation Using Etched Liquid Crystal Polymer Films

A method for constructing an adhesive-free composite substrate material for flexures used in e.g. TSA suspension applications uses an etchant treated liquid crystal polymer film placed in contact with a metal foil, preferably stainless steel, followed by application of pressure at elevated temperature to produce a bonded laminate having essentially two layers. In a preferred laminate, the liquid crystal polymer film first receives a seed layer of metal, as described above. The metal seeded film pressed against a metal foil provides a bonded laminate having a bonded interface on one side of the liquid crystal polymer and a seeded metal layer on the other. This composite has a number of advantages when used for flexures of hard disk drives. Compared to conventional laminated structures composites of the present invention provide an adhesive-free material having only one interface, whereas conventional laminates typically include four material interfaces. Reduction in the number of interfaces improves process efficiency and product reliability.

Laminated composites for flexures according to the present invention have essentially two layers of material bonded together with bond strengths from about 0.56 N/mm (3.21 b/in) to about 0.77 N/mm (4.41 b/in) as measured by standard test method IPC-TM 650 using an Instron peel tester, operating at a rate of 1.2 cm/minute. A composite may be formed and processed using a roll-to-roll method for cost-effective processing. Reduction in the number of layers contributes to further reduction in the weight of the composite. Lowering the weight of the composite allows construction of flexures having improved flexibility. Bond improvement between the liquid crystal polymer and support metal on one side and the metal seeded layer on the other adds to the integrity and durability of a composite structure. The metal-seeded layer further provides the alternative of printed circuit formation using an additive process, as previously described, rather than the subtractive process commonly used for forming electrically conductive traces on carrier substrates.

Processing to form composites used in constructing flexures for hard disk drives proceeds after obtaining liquid crystal polymer film. Suitable film materials may be obtained as e.g. BIAC®W.L. Gore and Associates, Inc., Newark, Del. or CT Film from Rogers Corporation, Rogers, Conn. Both sides of the film may be surface treated with alkaline etchant containing 40% potassium hydroxide and 20% ethanolamine. Etching occurs at temperatures between about 49° C. (120° F.) and 66° C. (150° F.) for times of about 30 seconds at lower temperatures to 10 seconds at higher temperatures in the range. One side of the etched film was further treated by exposure to ultraviolet radiation of about 200 mJ/cm$^2$. The film was in the form of a web moving at 10.5 cm/sec past an ultraviolet flashlamp. Exposure to ultraviolet radiation creates an amorphous surface for added adhesion of metal applied by sputter coating techniques to create a thin metal seeding layer to be augmented by metal plating including electroless plating and electrolytic plating.

The use of metal seeded layers allows the choice of either metal augmentation or metal subtraction to produce conductive metal traces on the surface of the liquid crystal polymer. Metal augmentation by an additive process adds no more metal than that required to produce conductive metal traces for a given application. Subtractive processing first requires application of a metal, such as copper, to give a plated layer of uniform thickness. Thereafter, conductive trace formation involves removal of excess copper to produce a desired circuit pattern.

Metal foil selected by physical characteristics, e.g. stainless steel A.I.S.I. 302, requires a surface etching treatment for optimum bonding to liquid crystal polymer film during lamination at high temperature and pressure. Etching by foil immersion in a solution of 30% HCl/15% HNO$_3$ was conducted at about 49° C. (120° F.) to about 66° C. (150° F.) for times from about 10 seconds to about 60 seconds. Treated surfaces of the stainless steel foil and liquid crystal polymer film were held against each other in a laminating press used to bond them together as a composite comprising a stainless steel support layer bonded to a liquid crystal polymer film having a seeded metal layer, or uniform coating on the surface opposite the stainless steel foil.

Interlayer bond strength of laminates according to the present invention was determined qualitatively using composite samples sized approximately 5 cm (2 inches)×5 cm (2 inches) or 5 cm (2 inches)×7.6 cm (3 inches). Table 8 shows conditions for lamination. Table 9 shows that optimal bonding requires surface etching of both the liquid crystal polymer film and the stainless steel foil.

TABLE 8

Laminating Conditions

| Sample | Temperature | Time | Pressure |
| --- | --- | --- | --- |
| L1 | 300° C. (572° F.) | 30 seconds | 2060 Kpa (300 psi) |
| L2 | 300° C. (572° F.) | 50 seconds | 2760 KPa (400 psi) |
| L3 | 315° C. (600° F.) | 30 seconds | 2060 KPa (300 psi) |
| L4 | 315° C. (600° F.) | 45 seconds | 2060 KPa (300 psi) |
| L5 | 315° C. (600° F.) | 55 seconds | 2060 KPa (300 psi) |
| L6 | 315° C. (600° F.) | 45 seconds | 2410 KPa (350 psi) |
| L7 | 315° C. (600° F.) | 45 seconds | 2760 KPa (400 psi) |
| L8 | 321° C. (610° F.) | 30 seconds | 2060 KPa (300 psi) |
| L9 | 321° C. (610° F.) | 45 seconds | 2760 KPa (400 psi) |

TABLE 9

Adhesion Of Stainless Steel Foil To Liquid Crystal Polymer Film

| LCP Treatment | SST Treatment | Result |
| --- | --- | --- |
| None | None | Delamination |
| Alkali Etchant | None | Delamination |
| None | Acid Etchant | Delamination |
| Alkali Etchant | Acid Etchant | LCP cohesive failure |

Flexure Construction

An improved flexure may be produced using a composite, as described above, having a layer of stainless steel for mechanical strength, and a liquid crystal polymer layer to provide an electrically insulating carrier for conductive traces formed on the surface of the liquid crystal polymer film using either additive plating techniques as described above or subtractive processing, also referred to conventionally as chemical milling. Either method produces the circuit pattern needed for interconnection of a magneto-resistive (MR) read-write head to a hard disk drive. As required the liquid crystal polymer carrier may include through-holes and related voids produced as described previously.

Full fabrication of a flexure for a trace suspension assembly requires modification of the stainless steel foil to remove portions of the metal to produce a patterned support for the flexure. Processing to provide the patterned support is well known. It involves protecting the exposed surface of the stainless steel foil using a photoresist material. After exposing the photoresist to an image pattern a developer solution exposes the metal foil that will be etched away to reveal the required pattern. The process is similar to that described in U.S. Pat. No. 5,145,553. After etching the stainless steel, a flexure according to the present invention comprises a liquid crystal polymer having a circuit pattern on one side and a patterned stainless steel support structure bonded to the other.

Flexible circuits comprising a liquid crystal polymer film, and methods for processing such a film, have been described herein. Film processing according to the present invention improves the bond between film substrate and metal and facilitates the preparation of additive conductive circuit patterns having through-holes and related shaped voids formed therein at elevated temperature using an aqueous etchant solution. Those of skill in the art will appreciate that, in light of the present disclosure, changes may be made to the embodiments described herein without departing from the spirit and scope of the present invention.

What is claimed is:

1. A composite material comprising:
    a film having a first etchant treated surface opposite a second etchant treated surface; and
    a metal foil having at least one acid treated surface having a bond to said first etchant treated surface of said film, said bond formed by application of a force to press said metal foil against said film at temperatures that cause flow of said film.

2. The composite material of claim 1, wherein said film comprises a liquid crystal polymer having a thickness from about 10 $\mu$m to about 50 $\mu$m.

3. The composite material of claim 2, wherein said film comprises a liquid crystal polymer having a thickness from about 15 $\mu$m to about 25 $\mu$m.

4. The composite material of claim 2, wherein said bond has a bond strength from about 5.6 N/cm to about 7.7 N/cm.

5. The composite of claim 2, wherein said liquid crystal polymer film is an extruded and tentered film.

6. The composite of claim 5, wherein said extruded and tentered film melts in a range from about 300° C. to about 365° C.

7. The composite material of claim 2, wherein said second etchant treated surface has a metal-seeded layer thereon.

8. The composite material of claim 1, wherein said metal foil is stainless steel, having a thickness from about 15 $\mu$m to about 25 $\mu$m.

9. The composite of claim 1, wherein said force is from about 2060 KPa to about 2760 KPa.

10. The composite of claim 1, wherein said first etchant treated surface and said second etchant treated surface are products of applying an alkaline etchant to opposing surfaces of said liquid crystal polymer film, said alkaline etchant comprising an aqueous solution containing from about 40 wt % to about 50 wt % of potassium hydroxide and from about 10 wt % to about 35 wt % of a solubilizer.

11. The composite of claim 1, wherein said at least one acid treated surface is the product of applying an acid thereto, said acid comprising an aqueous solution containing about 30% hydrochloric acid and about 15% nitric acid.

12. A flexure for a hard disk drive, said flexure including a laminate comprising:
    a film of a liquid crystal polymer, said film having a first etchant treated surface opposite a second etchant treated surface wherein said second etchant treated surface having at least one electrically conducting trace thereon; and
    a shaped metal foil having at least one acid treated surface having a bond to said first etchant treated surface of said liquid crystal polymer film, said bond formed by application of a force to press said metal foil against said liquid crystal polymer film at temperatures that cause flow of said liquid crystal polymer film.

13. The flexure of claim 12, wherein said liquid crystal polymer film is an extruded and tentered film.

14. The flexure of claim 13, wherein said extruded and tentered film melts in a range from about 300° C. to about 365° C.

15. The flexure of claim 12, wherein said second etchant treated surface includes metal seeding.

16. The flexure of claim 12, wherein said metal foil is stainless steel, having a thickness from about 15 $\mu$m to about 25 $\mu$m.

17. The flexure of claim 12, wherein said force is from about 2060 KPa to about 2760 KPa.

18. The flexure of claim 12, wherein said first etchant treated surface and said second etchant treated surface are products of applying an alkaline etchant to opposing surfaces of said liquid crystal polymer film, said alkaline etchant comprising an aqueous solution containing from about 40 wt % to about 50 wt % of potassium hydroxide and from about 10 wt % to about 35 wt % of a solubilizer.

19. The flexure of claim 12, wherein said at least one acid treated surface is the product of applying an acid thereto, said acid comprising an aqueous solution containing about 30% hydrochloric acid and about 15% nitric acid.

20. A composite material comprising:
    a film having a first etchant treated surface opposite a second etchant treated surface; and
    a metal foil having at least one acid treated surface having a bond to said first etchant treated surface of said film, wherein said at least one acid treated surface is the product of applying an acid thereto, said acid comprising an aqueous solution containing about 30% hydrochloric acid and about 15% nitric acid, said bond formed by application of a force to press said metal foil against said film at temperatures that cause flow of said film.

21. A flexure for a hard disk drive, said flexure including a laminate comprising:
    a film of a liquid crystal polymer, said film having a first etchant treated surface opposite a second etchant treated surface wherein said second etchant treated surface having at least one electrically conducting trace thereon; and
    a shaped metal foil having at least one acid treated surface having a bond to said first etchant treated surface of said liquid crystal polymer film, wherein said at least one acid treated surface is the product of applying an acid thereto, said acid comprising an aqueous solution containing about 30% hydrochloric acid and about 15% nitric acid, said bond formed by application of a force to press said metal foil against said liquid crystal polymer film at temperatures that cause flow of said liquid crystal polymer film.

* * * * *